United States Patent
Jin et al.

(10) Patent No.: US 7,485,536 B2
(45) Date of Patent: Feb. 3, 2009

(54) ABRUPT JUNCTION FORMATION BY ATOMIC LAYER EPITAXY OF IN SITU DELTA DOPED DOPANT DIFFUSION BARRIERS

(75) Inventors: Been-Yih Jin, Lake Oswego, OR (US); Brian S. Doyle, Portland, OR (US); Robert S. Chau, Beaverton, OR (US); Jack T. Kavalieros, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/326,178

(22) Filed: Dec. 30, 2005

(65) Prior Publication Data

US 2007/0155142 A1 Jul. 5, 2007

(51) Int. Cl.
*H01L 21/335* (2006.01)
(52) U.S. Cl. .................. 438/305; 438/301; 438/306; 438/526; 438/527; 438/529; 257/E21.043; 257/E21.044; 257/E21.049; 257/E21.054
(58) Field of Classification Search .................. 438/514, 438/517, 301, 305, 306, 526, 527, 529, 524; 257/E21.043, E21.044, E21.049, E21.054
See application file for complete search history.

(56) References Cited

U.S. PATENT DOCUMENTS

| | | | | |
|---|---|---|---|---|
| 4,949,136 A | * | 8/1990 | Jain | 257/344 |
| 5,545,575 A | * | 8/1996 | Cheng et al. | 438/304 |
| 5,627,097 A | * | 5/1997 | Venkatesan et al. | 438/217 |
| 5,759,901 A | * | 6/1998 | Loh et al. | 438/305 |
| 6,143,593 A | * | 11/2000 | Augusto | 438/199 |
| 6,383,876 B1 | * | 5/2002 | Son et al. | 438/289 |
| 6,566,204 B1 | * | 5/2003 | Wang et al. | 438/286 |
| 6,734,482 B1 | * | 5/2004 | Tran et al. | 257/296 |
| 6,808,971 B2 | * | 10/2004 | Bhattacharyya | 438/199 |
| 7,002,214 B1 | * | 2/2006 | Boyd et al. | 257/351 |
| 2002/0033511 A1 | * | 3/2002 | Babcock et al. | 257/408 |
| 2003/0235936 A1 | * | 12/2003 | Snyder et al. | 438/92 |
| 2006/0022270 A1 | * | 2/2006 | Boyd et al. | 257/351 |

OTHER PUBLICATIONS

Ritala et al., Atomic layer epitaxy- a valuable tool for nanotechnology?, Nanotechnology, 10 (1999) 19-24.*

* cited by examiner

*Primary Examiner*—Minh-Loan T Tran
*Assistant Examiner*—Minchul Yang
(74) *Attorney, Agent, or Firm*—Blakely, Sokoloff, Taylor & Zafman LLP

(57) ABSTRACT

A method including forming a channel region between source and drain regions in a substrate, the channel region including a first dopant profile; and forming a barrier layer between the channel region and a well of the substrate, the barrier layer including a second dopant profile different from the first dopant profile. An apparatus including a gate electrode on a substrate; source and drain regions formed in the substrate and separated by a channel region; and a barrier layer between a well of the substrate and the channel region, the barrier layer including a dopant profile different than a dopant profile of the channel region and different than a dopant profile of the well. A system including a computing device including a microprocessor, the microprocessor including a plurality of transistor devices formed in a substrate, each of the plurality of transistor devices including a gate electrode on the substrate; source and drain regions formed in the substrate and separated by a channel region; and a barrier layer between a well of the substrate and the channel region.

4 Claims, 4 Drawing Sheets

US 7,485,536 B2

ABRUPT JUNCTION FORMATION BY ATOMIC LAYER EPITAXY OF IN SITU DELTA DOPED DOPANT DIFFUSION BARRIERS

BACKGROUND

1. Field

Circuit devices and methods for forming circuit devices.

2. Background

A metal oxide semiconductor field effect transistor (MOSFET) is a common element of an integrated circuit such as a microprocessor or other circuit. The transistor typically includes a source and drain junction region formed in a semiconductor substrate and a gate electrode formed on a surface of the substrate. A gate length is generally the distance between the source and drain junction region. Within the substrate, the region of the substrate beneath the gate electrode and between the source and drain junctions is generally referred to as a channel with a channel length being the distance between the source and drain junctions.

A transistor device works generally in the following way. Carriers (e.g., electrons, holes) flow between source junction and drain junction by the establishment of contacts to the source and drain regions. In order to establish the carrier flow, a voltage is applied to the gate electrode to form an inversion layer of carriers in the channel. The minimum amount of gate voltage is generally referred to as a threshold voltage ($V_t$).

As noted above, many transistor devices are formed in a semiconductor substrate. The substrate body may be a bulk silicon substrate or a silicon on insulator (SOI) substrate. To form ohmic contacts to carriers in the channel, dopants are introduced (e.g., via ion implantation) into the substrate. Representatively, an N-type transistor device may have source and drain regions (and gate electrode) doped with an N-type dopant such as arsenic or phosphorous. The N-type regions are formed in a well that has previously been formed in the semiconductor substrate as a P-type conductivity. A suitable P-type dopant is boron.

The silicon and SOI body described above are designed to be fully depleted (i.e., removing of essentially all bulk charge carriers by an electric field). Fully depleted FET transistors tend to have better gate control on a channel potential than planar MOSFET devices at low drain bias $V_{DS}$. Full depletion however, does not ensure better short-channel effects (SCEs) at high $V_{DS}$ as the drain electric field can reach the source end through the substrate in bulk silicon wafers or through a buried oxide (BOX) layer in SOI wafers. In general, it is desired that SCEs are low such that the transistor off-state leakage current, $I_{OFF}$, (i.e., a current flowing between source and drain regions when a transistor is in an off state) remains as low as possible. SCEs may be determined by monitoring the subthreshold slope (SS) and drain induced barrier lowering (DIBL). Subthreshold slope, which is a measure of the gate coupling to the channel potential, is defined as $SS=dV_G/d[\log I_{DS}]$, where $V_G$ is the gate voltage and $I_{DS}$ is the drain-to-source current. DIBL, which is a measure of the threshold voltage shift versus drain bias, is defined as $DIBL=(V_{TLIN}-V_{TSAT})/(V_{DSAT}-V_{DLIN})$. $V_{TLIN}$ is the linear threshold voltage at low drain bias $V_{DLIN}$, typically 50 mV. $V_{TSAT}$ is the saturate threshold voltage at high drain bias $V_{DSAT}$, which is typically in the range of from 1 to 1.2V for current generation of logic transistors. A steeper SS and/or reduced DIBL shift indicates lower $I_{OFF}$.

Reduced drain-to-source coupling leads to better SCEs. Drain field penetration (i.e., drain-to-source coupling), may be reduced by scaling the substrate body size (e.g., thin body width $W_{Si}$ for double-gated transistors such as FinFETs, and thin $T_{Si}$ and $W_{Si}$ for triple-gated transistors such as tri-gates) or by introducing heavy doping in the source tip to channel and channel to drain tip junctions of bulk Si wafers or the Si body in SOI wafers. Very small body dimensions, however, are not desirable because of a potential for large external resistance ($R_{EXT}$).

In addition, heavy doping in the source tip to channel and channel to drain tip junctions is generally achieved by locally implanted dopants (P-type in N-type metal oxide semiconductor FETs (NMOSFETs) and N-type dopants in P-type metal oxide semiconductor FETs (PMOSFETs) introduced in the substrate body and in the case of the SOI substrate, in the Si body. Such implants are referred to as "halo" implants. Typical halo implants for NMOSFETs include boron and indium (In)). Halo implants for PMOSFETs include arsenic (As), antimony (Sb), and phosphorous (P). These halos are typically implanted at an angle resulting in potential overlap between the halos and source/drain (S/D) regions and/or tip regions. These Halo implant are more difficult to implement in a nonplanar FINFET or TRI-Gate configuration.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION

In the following description, a transistor device is described as is a method of forming the transistor device utilizing layer-by-layer growth of in-situ doped at the layers by atomic layer deposition.

Figure 1:
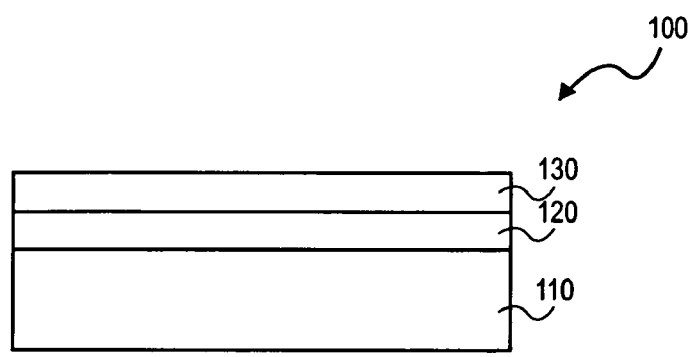
FIG. 1 shows a schematic side view of a portion of a circuit substrate having a barrier layer formed on a surface thereof and an active layer formed on a barrier layer.

FIG. 1 shows a side view of a portion of a circuit substrate. Structure 100 may form part of a wafer in which multiple chips or die will be formed. Structure 100 includes substrate 110 of a single crystal semiconductor material, representatively silicon. In one embodiment, substrate 110 is a P-type doped substrate, for example, a silicon substrate doped with boron. The following description details the formation of a P-type device (e.g., a PMOS). It is appreciated that similar techniques may be used to form an N-type device (e.g., an NMOS) by, for example, modifying the dopant species.

Overlying substrate 110 in FIG. 1 is barrier layer 120 of an intrinsic or n++ type material and active layer 130 of an n type material (where "n++" of barrier layer 120 indicates a greater concentration of dopant than "n" of active layer 130).

As will become clear later, a portion of active layer 130 will serve as a transistor device channel. In this embodiment, barrier layer 120 is selected of a material and thickness to inhibit off-state interface leakage of a transistor device. Representatively, barrier layer 120 and active layer 130 are each epitaxial layers formed in situ by an atomic layer deposition (ALD) process. Generally speaking, an atomic layer deposition process involves forming a film or layer in a layer-by-layer process by exposing a surface to alternating pulses of reactants, each of which undergoes a self-limiting reaction, generally resulting in controlled film deposition. In one embodiment, barrier layer 120 and active layer 130 are of a similar carrier (e.g., N-type) but the dopant profile is changed. In one embodiment, using an atomic layer deposition process, by alternating pulsing of chemical reaction precursors (e.g., silane, phosphine, methylsilane, etc.), dopant gas and hydrogen gas, barrier layer 120 is, for example, a carbon-doped $n^{++}$ material and active layer 130 is an n material.

As an example, a phosphine, arshine or antimony (Sb) source pulse width and flow rate determines the thicknesses and concentration profile of barrier layer 120 and active layer 130. A deposition temperature ranges from 450° C. to 900° C., and the pressure ranges from 10 torr to one atmosphere. Typical thicknesses for barrier layer 120 and active layer 130 are 10 angstroms (Å) to 100 Å, and 100 Å to 500 Å, respectively. The doping level of barrier layer 120 can be similar to a doping of a halo implant, while the doping level of active layer 130 can be similar to a well implant commonly used in planar MOSFET devices.

Figure 2:
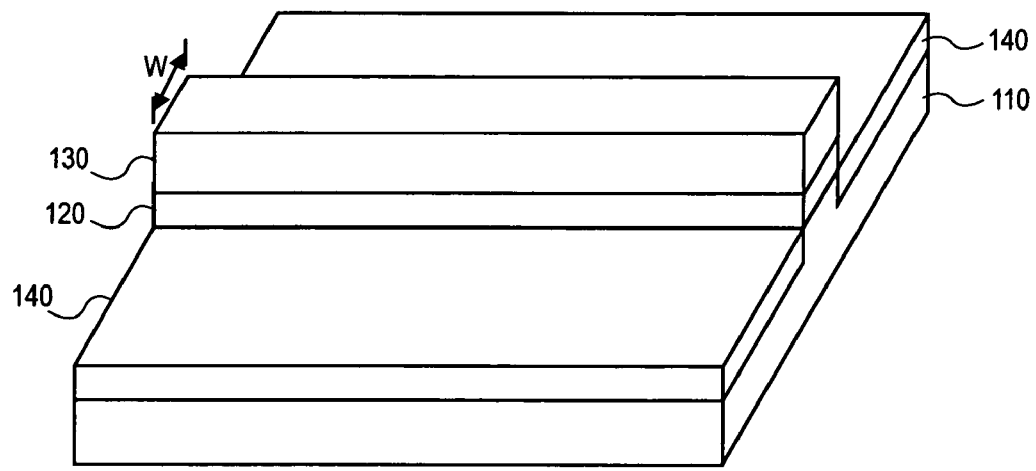
FIG. 2 shows a top perspective view of the structure of FIG. 1 after following the formation of trench isolation structures.

FIG. 2 shows the structure of FIG. 1 following the formation of trench isolation structures 140 in the substrate. In one embodiment, trench isolation structures 140 are formed by first defining the trench area using photolithographic and etching techniques (e.g., protecting a defined area of active layer 130), followed by a deposition (e.g., chemical vapor deposition (CVD)) of a dielectric material such as silicon dioxide. FIG. 2 shows trench isolation 140 formed in substrate 110 adjacent (on opposite sides) of a defined are of active layer 130 over barrier layer 120. In one embodiment, a width dimension, W, of active layer 130 is selected to define a gate width of a transistor device.

Figure 3:
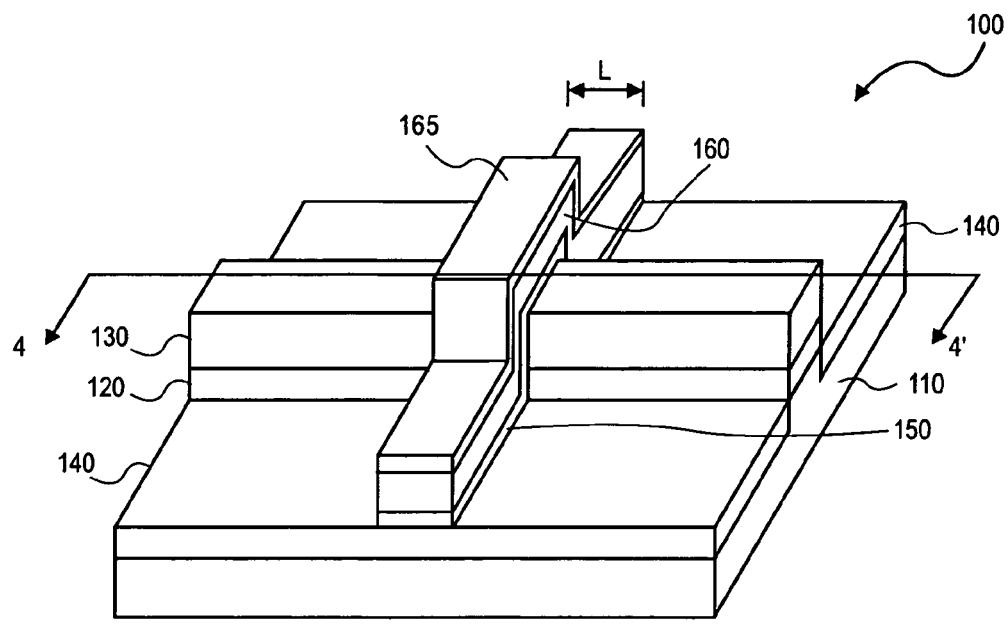
FIG. 3 shows the structure of FIG. 2 following the formation of a gate dielectric and gate electrode (with a dielectric etch stop on the gate electrode) on the structure.

FIG. 3 shows the structure of FIG. 2 following the formation of a gate dielectric and gate electrode over active layer 130. In one embodiment, gate dielectric 150 is a dielectric material conformally deposited over trench isolation structures 140 and active layer 130. Gate dielectric 150 is selected of a dielectric material such as silicon dioxide or a material having a dielectric constant greater than silicon dioxide. Following the deposition of gate dielectric 150, a gate electrode material may be conformally deposited over the gate dielectric material e.g., over trench isolation structures 140 and active layer 130. A suitable material for a gate electrode is, for example, a metal material selected to have a work function, in this embodiment, equivalent to a P-type device. Following a conformal deposition of materials for gate dielectric 150 and gate electrode 160, dielectric etch stop layer 165 of, for example, a silicon nitride or silicon oxide nitride material is deposited on a material for gate electrode. Following deposition of dielectric etch stop layer 165, the materials may be patterned to define a gate electrode (e.g., a desired gate length, L). A photolithographic and etching process may be used to define gate electrode 160 and gate dielectric 150. Dielectric etch stop layer 165 is shown on defined gate electrode 160.

Figure 4:
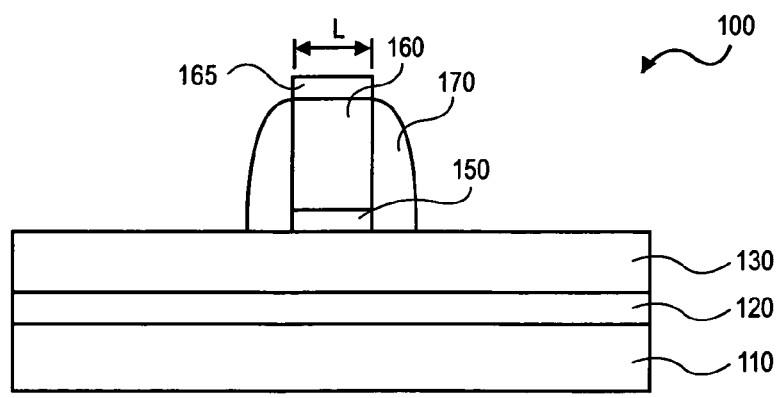
FIG. 4 shows a cross-sectional side view through lines 4-4' of FIG. 3 and the formation of sidewall spacers adjacent the gate electrode.
Figure 5:
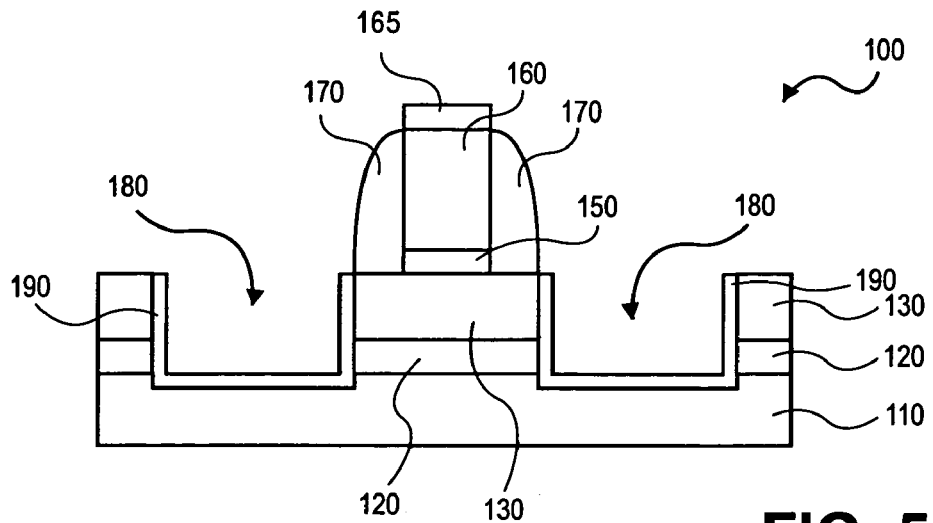
FIG. 5 shows the structure of FIG. 4 following the definition of source and drain regions in the substrate adjacent the gate electrode.

FIG. 4 shows a cross-sectional side view of the structure of FIG. 3 through lines 4-4'. FIG. 4 also shows the formation of sidewall spacers 170 adjacent gate electrode 160 (e.g., on opposing sidewalls of gate electrode 160). In one embodiment sidewall spacers 170 are a dielectric material of, for example, silicon dioxide or silicon nitride. FIG. 5 shows the structure of FIG. 4 following the definition of source and drain regions adjacent gate electrode 160 in the composite substrate including substrate 110, barrier layer 120, and active layer 130. In one embodiment, source and drain regions 180 are formed to a depth extending through active layer 130 and barrier layer 120 into substrate 110. In this embodiment, source and drain regions 180 are self-aligned to sidewall spacers 170 adjacent gate electrode 160. An anisotropic etch chemistry selective for silicon over, for example, silicon dioxide or silicon nitride (sidewall spacers 170) may be used to form source and drain regions 180.

FIG. 5 also shows the formation of barrier layer 190 conformally within each of source and drain regions 180. In one embodiment, barrier layer 190 is formed by an atomic layer deposition process. Barrier layer is selected, in one embodiment, of a material and a thickness that will inhibit diffusion of source and drain material dopants into a channel region of the device. In one embodiment, an ALD process is used to deposit a layer of N-type material conformally on the sidewalls and base of the defined source and drain regions in the composite substrate. In one embodiment, a dopant profile of barrier layer 190 is similar to a dopant profile of barrier layer 120 (e.g., similar material and dopant concentration ($n^{++}$ carbon doped material)). A representative thickness of barrier layer 190 is in the range of 10 Å to 100 Å.

Figure 6:
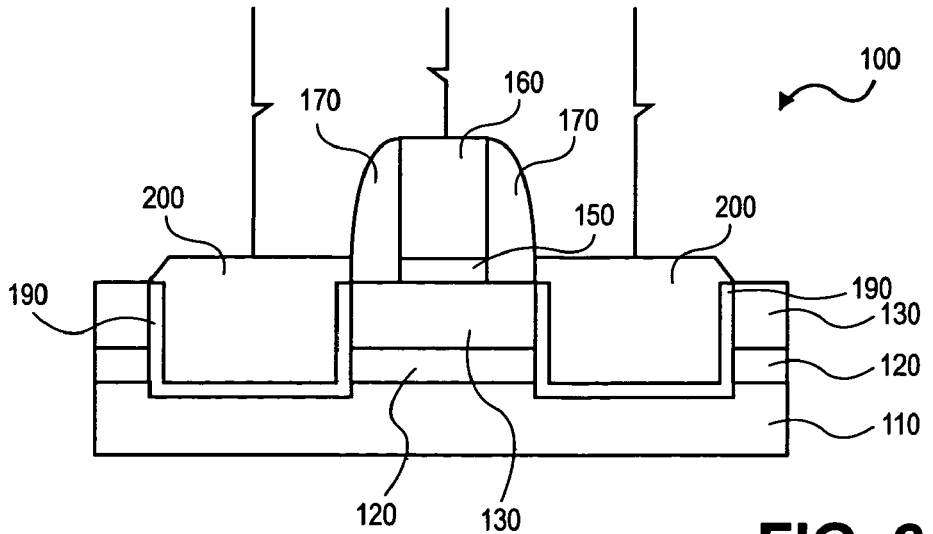
FIG. 6 shows the structure of FIG. 5 following the formation of source and drain regions in the substrate (and removal of the dielectric etch stop).

FIG. 6 shows the structure of FIG. 5 following the deposition of material in source and drain regions 180. In one embodiment, source and drain material 200 is a P-type epitaxial material deposited to a thickness greater than a height of the composite structure so as to form a non-planar transistor device. In one embodiment, material 200 is a $p^{++}$ epitaxial silicon germanium. The source and drain material can be deposited with LPCVD epitaxial growth using SiH4, GeH4, and B2H6 gases.

Following the deposition of source and drain material 200, the dielectric etch stop 165 is selectively removed, and the source and drain material may be converted to a silicide. Interlayer isolation, contacts and interconnect structures may then be formed to source and drain regions 200 and gate electrode 160.

FIG. 6 shows a P-type metal oxide semiconductor (MOS) device having junction regions isolated/defined by barrier layer 190 in channel region formed of active layer 130 and defined by barrier layer 120 and barrier layer 190 beneath gate electrode 160. Structure 100 shown in FIG. 6 is, for example, a PMOS device of a complimentary metal oxide semiconductor (CMOS). Structure 100 may be connected through conductive interconnect material to an adjacent NMOS device to form the CMOS. It is appreciated that although a PMOS structure is shown, the same principles may be applied to form an NMOS device.

Figure 7:
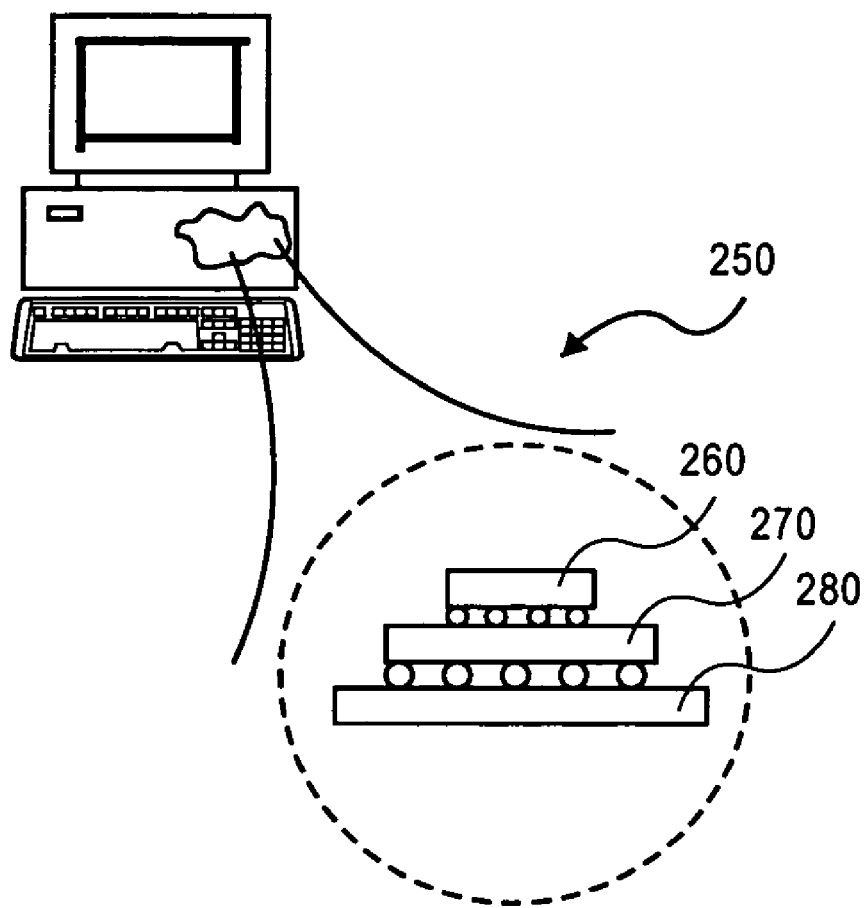
FIG. 7 shows a computer system including a microprocessor having transistors formed according to an embodiment shown in FIGS. 1-6.

FIG. 7 shows a cross-sectional view of an integrated circuit package that can be physically and electrically connected to a printed wiring board or printed circuit board (PCB) to form an electronic assembly. The electric assembly can be part of an electronic system such as a computer (e.g., desktop, laptop, handheld, server, etc.), wireless communication device (e.g., cellular phone, cordless phone, pager, etc.), computer-related peripheral (e.g., printer, scanner, monitor, etc.), entertainment device (e.g., television, radio, stereo, tape and compact disc player, video cassette recorder, motion picture expert group audio player 3 player (MP3), and the like. FIG. 7 illustrates the assembly is part of a desktop computer. FIG. 7 shows electronic assembly 250 including die 260 physically and electrically connected to packet substrate 270. Die 260 is an integrated circuit die, such as a microprocessor die, having one or more transistor structures formed as described with reference to FIGS. 1-6. Electrical contact points (e.g., contact pads on a surface of die 260) are connected to packet substrate 270 through, for example, a conductive bump layer. Packet substrate 270 may be used to connected die 260 to printed circuit board 280 such as a motherboard or other circuit board.

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. A method comprising:
   forming a channel region between a source region and a drain region in a layer on a substrate, a material of the channel region comprising a first dopant profile;
   forming a first barrier layer between the channel region and a well of the substrate, the first barrier layer comprising a second dopant profile different from the first dopant profile wherein the first dopant profile and the second dopant profile comprise a similar carrier;
   defining the source region and the drain region such that the source region and the drain region extend through the first barrier layer;
   forming a second barrier layer between the source region and the well and between the drain region and the well; and
   forming a source material in the source region and a drain material in the drain region and the channel and the drain material and the channel,
   wherein the second barrier layer is disposed between the source material and the channel and the drain material and the channel, and
   wherein the second barrier layer comprises a dopant profile different than a dopant profile of a material of the well and a dopant profile of each of the material of the source region and the material of the drain region.

2. The method of claim 1, wherein forming the barrier layer comprises atomic layer deposition processing.

3. The method of claim 1, where the dopant profile of the material of the well and the dopant profile of the material of the source material and the material of the drain material comprise a similar carrier.

4. The method of claim 1, wherein forming the second barrier layer comprises atomic layer deposition processing.

* * * * *